United States Patent
Kurokawa

(10) Patent No.: US 9,329,214 B2
(45) Date of Patent: May 3, 2016

(54) FREQUENCY JUDGMENT DEVICE, VOLTAGE COMPARATOR CIRCUIT, AND FREQUENCY MEASUREMENT DEVICE

(75) Inventor: Fujio Kurokawa, Nagasaki (JP)

(73) Assignee: NAGASAKI UNIVERSITY, NATIONAL UNIVERSITY CORPORATION, Nagasaki-Shi, Nagasaki (JP)

( * ) Notice: Subject to any disclaimer, the term of this patent is extended or adjusted under 35 U.S.C. 154(b) by 19 days.

(21) Appl. No.: 13/499,633

(22) PCT Filed: Sep. 30, 2010

(86) PCT No.: PCT/JP2010/067191
§ 371 (c)(1),
(2), (4) Date: Aug. 11, 2012

(87) PCT Pub. No.: WO2011/040592
PCT Pub. Date: Apr. 7, 2011

(65) Prior Publication Data
US 2012/0326751 A1 Dec. 27, 2012

(30) Foreign Application Priority Data
Sep. 30, 2009 (JP) .................................. 2009-229145

(51) Int. Cl.
| G01R 23/02 | (2006.01) |
| H03K 5/26 | (2006.01) |
| G01R 23/00 | (2006.01) |
| G01R 23/15 | (2006.01) |
| H03K 5/19 | (2006.01) |

(52) U.S. Cl.
CPC .............. *G01R 23/005* (2013.01); *G01R 23/02* (2013.01); *G01R 23/15* (2013.01); *H03K 5/19* (2013.01); *H03K 5/26* (2013.01)

(58) Field of Classification Search
CPC .......... G01R 23/02; G01R 23/15; H03K 5/19; H03K 5/26
USPC ............... 327/39–45, 47, 49, 102; 324/76.39, 324/76.41, 76.47
See application file for complete search history.

(56) References Cited

U.S. PATENT DOCUMENTS

| 6,259,279 B1 * | 7/2001 | Galbraith et al. ................ 327/49 |
| 2002/0008548 A1 * | 1/2002 | Kimura ........................... 327/39 |
| 2012/0062299 A1 * | 3/2012 | Kurokawa ..................... 327/237 |

FOREIGN PATENT DOCUMENTS

| JP | 02-196511 A | 8/1990 |
| JP | 11-127142 A | 5/1999 |
| JP | 2003-332898 A | 11/2003 |
| JP | 2003-344463 A | 12/2003 |

* cited by examiner

*Primary Examiner* — Patrick O'Neill
(74) *Attorney, Agent, or Firm* — Kile Park Reed & Houtteman PLLC

(57) ABSTRACT

The frequency decision device determines frequency of the measured rectangular signal by simple and easy means. The frequency decision device inputs the measured rectangular signal that frequency (or period) changes dynamically. It generates a rectangular reference signal of predetermined on width τ synchronizing to the edge based on a positive going edge of this measured rectangle signal. And it watches the order of measured rectangle signal and falling edges of the rectangular reference signal. When this sequential order reversed, it detects that length of the ON time of ON time of the measured rectangle signal and the measured rectangular signal reversed.

4 Claims, 17 Drawing Sheets

Fig. 15
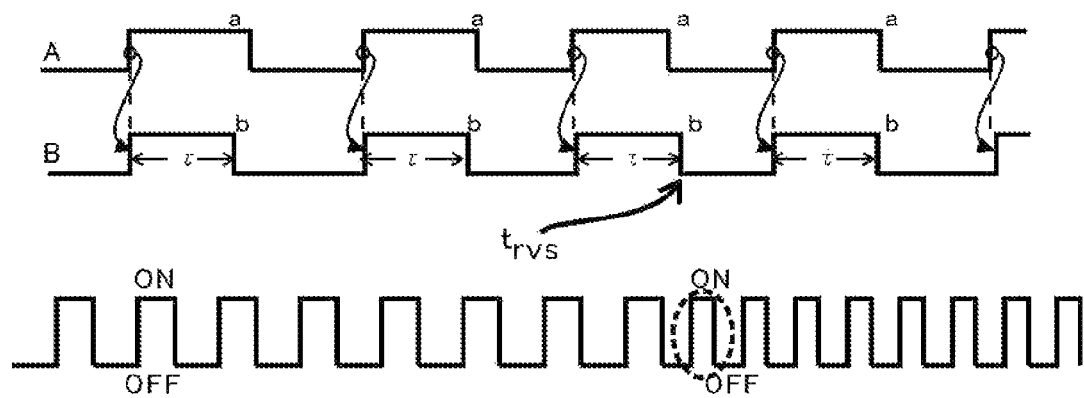
(A)
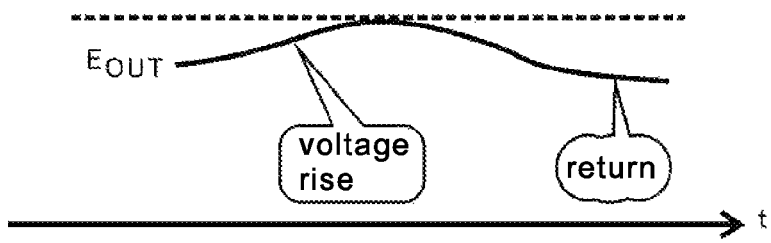
(B)

FREQUENCY JUDGMENT DEVICE, VOLTAGE COMPARATOR CIRCUIT, AND FREQUENCY MEASUREMENT DEVICE

A FIELD OF THE INVENTION

The present invention relates to a frequency detection apparatus, voltage comparator and a frequency measurement device which can determine whether a frequency of the measured signal pulse is higher or lower than a reference frequency, wherein, measured a signal pulse is compared with the reference signal pulse which delayed than measured signal for predetermined time.

BACKGROUND-ART

In frequency judgment, it is detected whether a frequency of a measured signal pulse reached reference frequency.

In this case, signal pulses of reference frequency are generated, and phase of the measured signal pulse is compared with phase of this reference frequency signal.

As this kind of technique, a technique using a recursive discrete Fourier transform or the technique using the AFC (Automatic Frequency Control) loop is known.

ADVANCED TECHNOLOGY LITERATURE

Patent Document

PATENT DOCUMENT 1: Jp No. 2003-344,463

SUMMARY OF THE INVENTION

A Problem to be Solved by the Invention

However, in these prior art, a reference signal generator and a phase detector are required. Thus, there is a problem that circuits are complicated.

An object of the present invention is to provide a frequency decision device, a voltage comparator and a frequency measurement device which can detect a frequency by a constant width pulse.

A Means for Solving Problem

A frequency decision device of the present invention that a duty is applied to constant measured signal assumes (1), (2) and (3) subject matter.

(1)

A frequency decision device which inputs a judgment target signal pulses of a predetermined duty ratio, and determines a frequency of the judgment target signal pulses comprises, a reference signal pulse generator that generates a reference signal pulse of which a rise synchronizes with a rise of the judgment target signal pulse and of which a time width from the rise to a fall is predetermined, and a timing comparator that compares first timing which is a fall of a judgment target signal pulse and second timing which is a fall of a reference signal pulse, wherein a frequency of a judgment target signal pulse to reference frequency is judged on the basis of the order of the first timing and the second timing.

The reference frequency is represented in next formula.

$$f_{REF} = R_{DUTY}/(\tau + T_{DELAY})$$

$f_{REF}$: reference frequency $R_{DUTY}$: duty ratio ($0 < R_{DUTY} < 1$) of the judgment target signal pulse $\tau$: a time width from rising edge to falling edge of the reference signal pulse $T_{DELAY}$: a delay time of a rise of the reference signal pulse to a rise of the judgment target signal pulse. The lag time of the rising edge of the reference signal pulse to the rising edge of the judgment target signal pulse ($0 \leq T_{DELAY} < R_{DUTY}*$(a period of the judgment target signal pulse)).

(2)

The frequency of the judgment target signal pulse characterizes being at least one of the next relations the frequency decision device described in (1).

The first timing<the second timing
The first timing≤the second timing
The first timing=the second timing
The first timing≥the second timing
The first timing>the second timing (3)

A frequency decision device described in (1) or (2), wherein "rise" is rearranged by "fall" and "fall" is rearranged by "rise".

A frequency decision device of the present invention that a duty is applied to variable judgment target signal pulse assumes (4), (5) or (6) subject matter.

(4)

A frequency decision device which inputs a judgment target signal pulses, and determines a frequency of the judgment target signal pulses comprises, a dividing judgment target signal pulse generator which generates dividing judgment target signal pulses that two periods of the judgment target signal pulses are one period, a reference signal pulse generator that generates a reference signal pulse of which a rise synchronizes with a rise of the dividing judgment target signal pulse and of which a time width from the rise to a fall is predetermined, and a timing comparator that compares first timing which is a fall of a dividing judgment target signal pulse and second timing which is a fall of a reference signal pulse, wherein a frequency of a judgment target signal pulse to the reference frequency is judged on the basis of the order of the first timing and the second timing.

The reference frequency is represented in the next formula.

$$f_{REF} = R_{DUTY}/(\tau + T_{DELAY})$$

$f_{REF}$: reference frequency $R_{DUTY}$: duty ratio ($0 < R_{DUTY} < 1$) of the judgment target signal pulse $\tau$: a time width from rising edge to falling edge of the reference signal pulse $T_{DELAY}$: a delay time of a rise of the reference signal pulse to a rise of the judgment target signal pulse.

The lag time of the rising edge of the reference signal pulse to the rising edge of the judgment target signal pulse ($0 \leq T_{DELAY} < R_{DUTY}*$(a period of the judgment target signal pulse)).

(5)

A frequency of the judgment target signal pulse characterizes being at least one of the next relations the frequency decision device described in (4).

The first timing<the second timing
The first timing≤the second timing
The first timing=the second timing
The first timing≥the second timing
The first timing>the second timing (6)

A frequency decision device described in (4) or (5), wherein "rise" is rearranged by "fall" and "fall" is rearranged by "rise".

A frequency decision device of the present invention that a duty is applied to unvariable judgment target signal pulse and that two inversion reference signals are contained assumes (7), (8), (9) or (10) subject matter.

(7)

A frequency decision device which inputs a judgment target signal pulses, and determines a frequency of the judgment target signal pulses comprises,
a dividing judgment target signal pulse generator which generates dividing judgment target signal pulses that two periods of the judgment target signal pulses are one period, a inversion dividing judgment target signal pulse generator which generates an inversion dividing judgment target signal pulse that the dividing judgment target signal pulse is inversed, a reference signal pulse generator that generates a reference signal pulse of which a rise synchronizes with a rise of the dividing judgment target signal pulse and of which a time width from the rise to a fall is predetermined, a timing comparator that compares second timing which is falling edge of reference signal pulse with first timing which is the falling edge of the divided measured signal pulse, and compares fourth timing which is falling edge of reference signal pulse with third timing which is the falling edge of the inversion divided measured signal pulse, wherein a frequency of divided measured signal pulse to first reference frequency is determined by a sequential order with first timing and second timing, or a frequency of divided measured signal pulse to second reference frequency is determined by a sequential order with third timing and fourth timing.

The first reference frequency and second reference frequency are represented in the next formula.

first reference frequency $f_{REF1}=1/(\tau_1+T_{DELAY1})$ second reference frequency $f_{REF2}=1/(\tau_2+T_{DELAY2})$ $f_{REF1}$: first reference frequency
$f_{REF2}$: second reference frequency
$\tau_1$: a time width from rising edge to falling edge of the first reference signal pulse
$\tau_2$: a time width from rising edge to falling edge of the second reference signal pulse
$T_{DELAY1}$: a delay time of a rise of the first reference signal pulse to a rise of the first divided measured signal pulse ($0 \leq T_{DELAY1} < R_{DUTY1}$*(a period of measured signal pulse))
$T_{DELAY2}$: a delay time of a rise of the first reference signal pulse to a rise of the first inversion divided measured signal pulse ($0 \leq T_{DELAY2} < R_{DUTY1}$*(a period of divided measured signal pulse)).

(8)

A frequency of the judgment target signal pulse is the frequency decision device described in (7) including being at least one set of the relational expression of follows.
The first timing<the second timing or
The third timing<the fourth timing,
The first timing≤the second timing or
The third timing≤the fourth timing,
The first timing=the second timing or
The third timing=the fourth timing,
The first timing≥the second timing or
The third timing≥the fourth timing,
The first timing>the second timing or
The third timing>the fourth timing.

(9)

A frequency decision device described in (7) or (8),
wherein "A rising edge" is replaced with "a falling edge", and "a falling edge" is replaced with "a rising edge".

A frequency decision device described in (7), (8) or (9), wherein time width$\tau_1$ is time width $\tau$ same as time width $\tau_2$, time width$\tau_1$ is a period from the rising edge to a falling edge of first reference signal pulse, and time width$\tau_2$ is a period from the rising edge to a falling edge of second reference signal pulse.

The frequency decision device of the present invention assumes (11), (12), (13), (14) subject matter (the frequency decision device is applied to the judgment target signal pulse of the variable duty and has two inversion reference signals).

(11)

A frequency decision device comprises, first divided measured signal pulse generator which generates the first divided measured signal pulse which assumes two periods one period which it counted from a rising edge of the judgment target signal pulse by input of the judgment target signal pulse, second divided measured signal pulse generator which generates the second divided measured signal pulse that one period is two periods counted from a falling edge of judgment target signal pulse, first reference signal pulse generator which generates first reference signal pulse that a falling edge has time width from a rising edge at preset time, wherein rising edge synchronizes in the rising edge of the first divided measured signal pulse, second reference signal pulse generator which generates second divided measured signal pulses that the time width from a rising edge to a falling edge is the same as the predetermined time width and a falling edge synchronizes in a rising edge of second divided measured signal pulse, first timing comparator which compares first timing that is a falling edge of divided measured signal pulse and second timing that is a falling edge of first reference signal pulse, second timing comparator which compares third timing that is a falling edge of divided measured signal pulse and fourth timing that is a falling edge of first reference signal pulse, a frequency of the first divided measured signal pulse to first reference frequency is judged by sequential order between first timing and the second timing, or a frequency of the second divided measured signal pulse to second reference frequency is judged by sequential order between third timing and fourth timing.

The first reference frequency and the second reference frequency are represented in the next formula.

first reference frequency $f_{REF1}=1/(\tau_1+T_{DELAY1})$ second reference frequency $f_{REF2}=1/(\tau_2+T_{DELAY2})$ $f_{REF1}$: first reference frequency
$f_{REF2}$: second reference frequency
$\tau_1$: a time width from rising edge to falling edge of the first reference signal pulse
$\tau_2$: a time width from rising edge to falling edge of the second reference signal pulse
$T_{DELAY1}$: a delay time of a rise of the first reference signal pulse to a rise of the first divided measured signal pulse ($0 \leq T_{DELAY1} < R_{DUTY1}$*(a period of measured signal pulse).
$T_{DELAY2}$: a delay time of a rise of the second reference signal pulse to a rise of the second divided measured signal pulse ($0 \leq T_{DELAY2} < R_{DUTY1}$*(a period of divided measured signal pulse)).

(12)

A frequency of the judgment target signal pulse is the frequency decision device described in (11) including being at least one set of the relational expression of follows.
The first timing<the second timing or
The third timing<the fourth timing,
The first timing≤the second timing or
The third timing≤the fourth timing,
The first timing=the second timing or The third timing=the fourth timing,
The first timing≥the second timing or
The third timing≥the fourth timing,
The first timing>the second timing or
The third timing>the fourth timing.
(13)
A frequency decision device described in (11) or (12), wherein "A rising edge" is replaced with "a falling edge", and "a falling edge" is replaced with "a rising edge".
(14)
A frequency decision device according to (11), (12) or (13),
Wherein time width $\tau_1$ is time width t same as time width $\tau_2$, time width $\tau_1$ is a period from the rising edge to a falling edge of first reference signal pulse, and time width $\tau_2$ is a period from the rising edge to a falling edge of second reference signal pulse.

The voltage comparator of the present invention assumes (15), (16), (17), (18) subject matter.
(15)
A voltage comparator using the frequency judgment described in (1), (2) or (3), wherein judgment target signal pulse is listing of the voltage-to-frequency converter, the input voltage of the voltage-to-frequency converter is compared with the voltage value corresponding to the reference frequency described in (1).
(16)
Voltage comparator using the frequency judgment circuit described in either (4)-(6), wherein the voltage comparator including it is listing of the voltage-to-frequency converter, and judgment target signal pulse comparing the input voltage of the voltage-to-frequency converter with the voltage value corresponding to the reference frequency described in (4).
(17)
Voltage comparator using the frequency judgment circuitry described in (10), wherein the judgment target signal pulse is listing of the voltage-to-frequency converter, input voltage of the voltage-to-frequency converter is compared with the voltage value corresponding to the same reference frequency described in (10).
(18)
Voltage comparator using the frequency judgment circuitry described in (14), wherein the voltage comparator including it is listing of the voltage-to-frequency converter, and judgment target signal pulse comparing the input voltage of the voltage-to-frequency converter with the voltage value corresponding to the same reference frequency described in (14).

The frequency measurement equipment of the present invention assumes (19), (20), (21), (22) subject matter.
(19)
A frequency decision device according to either of (1)-(3), wherein the frequency measurement equipment including detecting frequency of the above judgment target signal pulse by sweeping value of width t at the time from the rising edge of the reference signal pulse to a fall.
(20)
A frequency decision device according to either of (4)-(6), wherein, the frequency measurement equipment including detecting frequency of the above judgment target signal pulse by sweeping value of width t at the time from the rising edge of the reference signal pulse to a fall.
(21)
A frequency decision device according to (10), wherein the frequency measurement equipment including detecting frequency of the judgment target signal pulse by sweeping value of width t at the sameness time.
(22)
A frequency decision device according to (14), wherein, the frequency measurement equipment including detecting frequency of the judgment target signal pulse by sweeping value of width t at the sameness time.

An Effect of the Invention

According to the present invention, using a simple technique, it can perform comparison (a frequency judgment, voltage comparison or a frequency measurement) of the ON time (or off times) of the pulse.

BRIEF DESCRIPTION OF DRAWINGS

FIG. 8 shows the relationship between measured signal pulse and divided measured signal pulse and reference signal pulse.
FIG. 13 is a block diagram which shows an example of DC/DC converter which voltage comparator of the present invention is applied to.
FIG. 15(A) is a illustration which shows operation of the control device of FIG. 14.
FIG. 15(B) is illustration showing state that the output of the DC/DC converter increases.

A FORM TO CARRY OUT INVENTION

Figure 1:
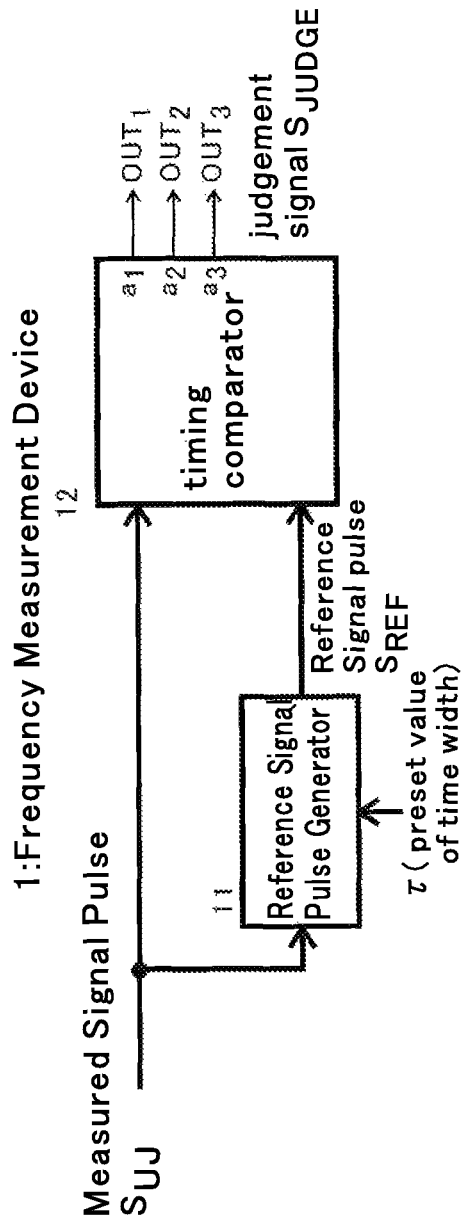
FIG. 1 is a block diagram which shows first embodiment of frequency decision device of the present invention.

FIG. 1 is a block diagram which shows first embodiment of a frequency decision device of the present invention. A frequency decision device 1 of FIG. 1 comprises a reference signal pulse generator 11 and a timing comparator 12. The frequency decision device 1 inputs measured signal pulses $S_{UJ}$ of duty ratio $R_{DUTY}$. The frequency decision device 1 can determine a frequency high/low state of measured signal pulses $S_{UJ}$.

The reference signal pulse generator 11 generates reference signal pulses $S_{REF}$. A rising edge of reference signal pulse $S_{REF}$ synchronizes in a rising edge or a falling edge of measured signal pulse $S_{UJ}$. A time width from a rising edge to a falling edge is predetermined time width $\tau_H$. The measured signal pulses $S_{UJ}$ in the present embodiment are pulses modulated by frequency, and a duty ratio of the pulses is typically constant.

Figure 2:
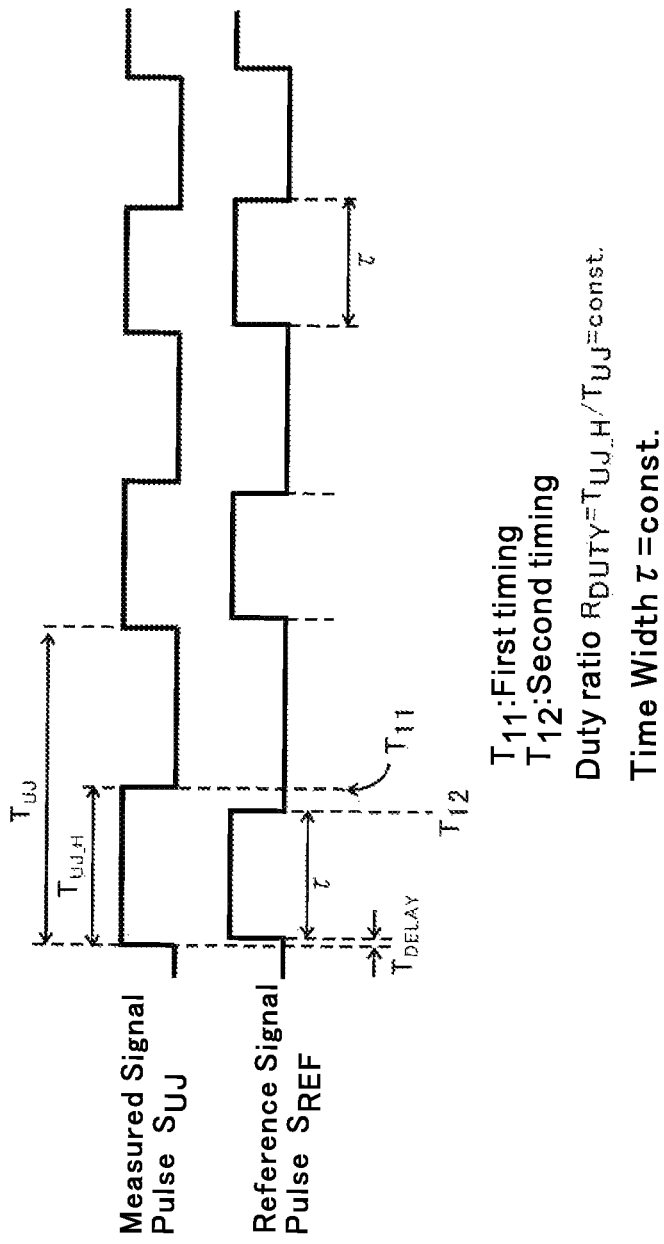
FIG. 2 is a figure which shows relations of measured signal pulse and reference signal pulse (T11 is slower than T12).

A relation (when $T_{11}$ is slower than $T_{12}$) of measured signal pulses $S_{UJ}$ and reference signal pulses $S_{REF}$ is shown in FIG. 2. A timing comparator 12 compares a falling edge (first timing T11) of the measured signal pulse $S_{UJ}$ and a falling edge (second timing T12) of the reference signal pulse $S_{REF}$.

In this embodiment, results of comparison by the timing comparator 12 are three kinds of next.

First timing $T11$<Second timing $T12$ (1-1)

First timing $T11$=Second timing $T12$ (1-2)

First timing $T11$>Second timing $T12$ (1-3)

A reference frequency $f_{REF}$ is defined by next formula.

$$f_{REF}=R_{DUTY}/(\tau \pm T_{DELAY})$$

$R_{DUTY}$: Duty ratio of measured signal pulses (0<$R_{DUTY}$<1)
$\tau$: Time width T from rising edge to falling edge of a reference signal pulse.
$T_{DELAY}$: Delay time of a rising edge of a reference signal pulse to a rising edge of a measured signal pulse (0≤$T_{DELAY}$<$R_{DUTY}$*(period of measured signal pulses).

In this embodiment, judgment results output device 13 comprise three output terminal $o_1$, $o_2$, $o_3$.

$OUT_1$ is output from output terminal $o_1$, $OUT_2$ is output from output terminal $o_2$, and $OUT_3$ is output from output terminal $o_3$.

Figure 3:
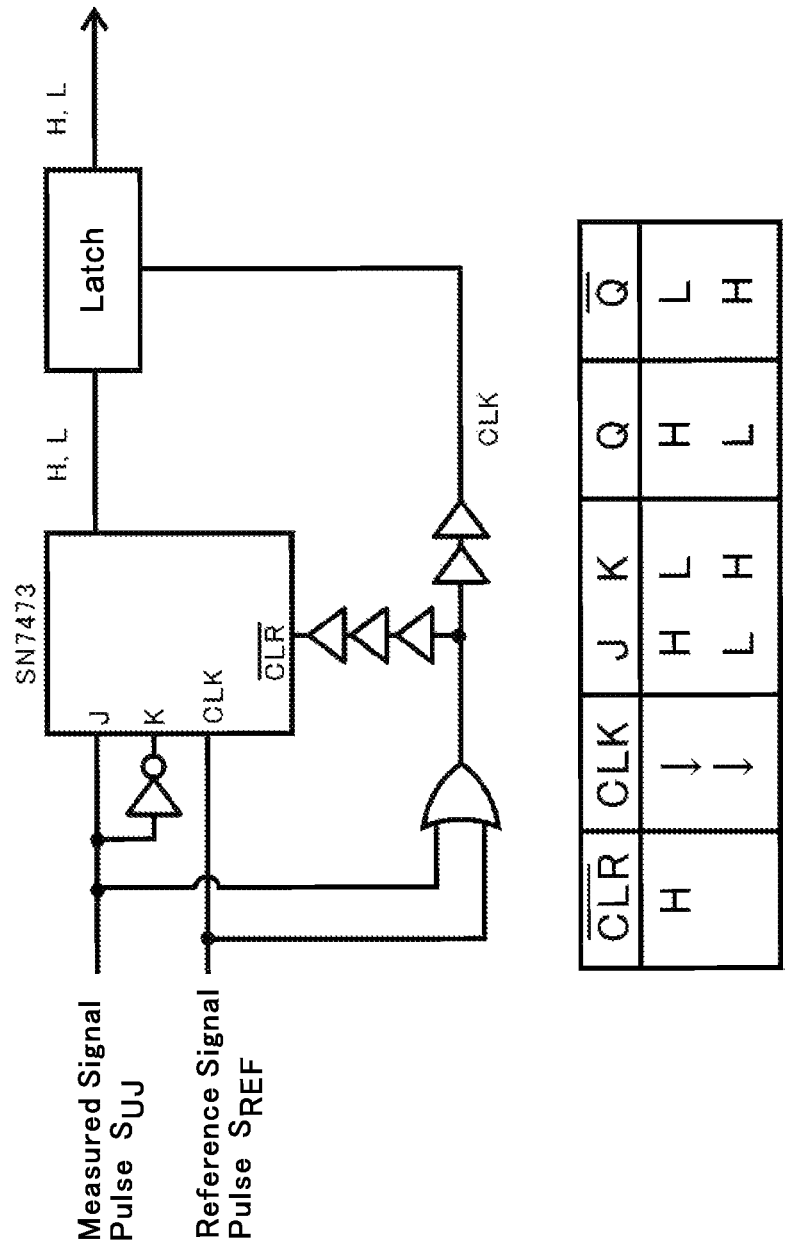
FIG. 3 is a specific circuit diagram which shows a reference signal pulse generator and a timeliness comparator.
Figure 4:
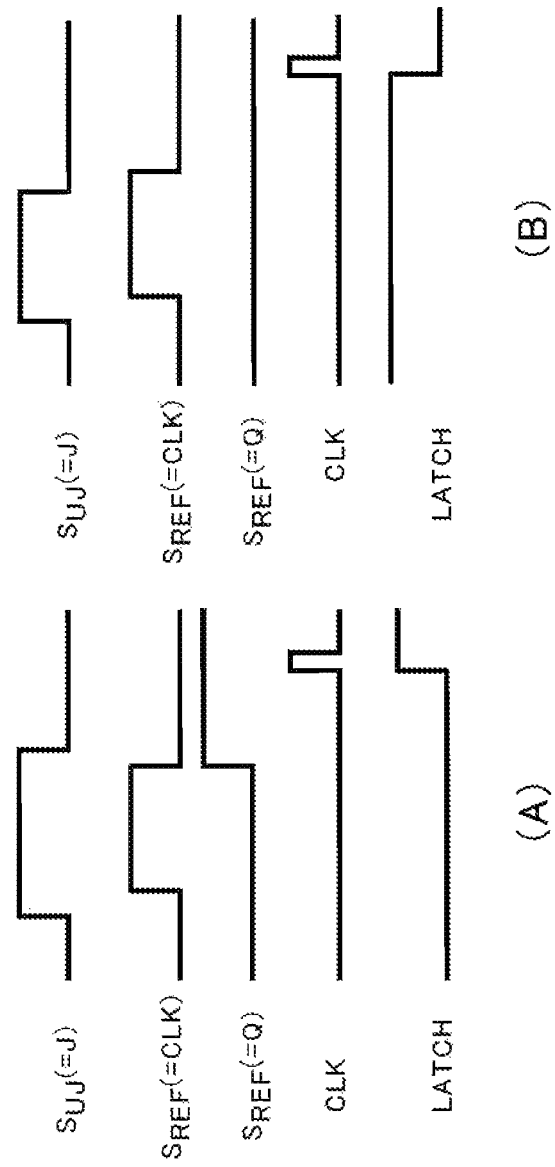
FIGS. 4 (A), (B) are waveform diagrams which show operation of the circuit of FIG. 3.

A reference signal pulse generator 11 and a timing comparator 12 are shown in FIG. 3. Operation waveforms of circuit of FIG. 3 are shown in FIGS. 4 (A), (B).

Figure 5:
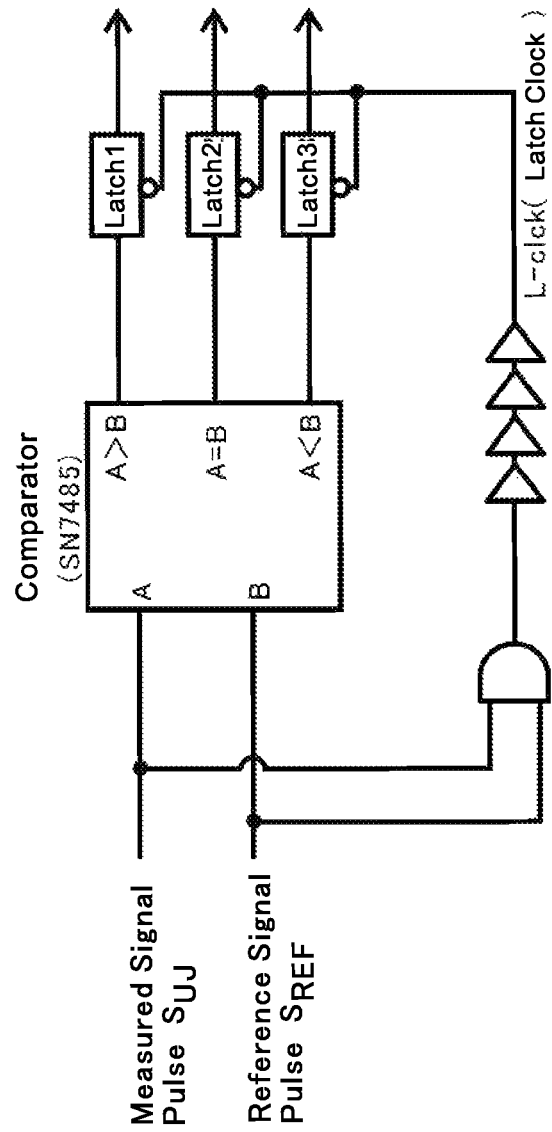
FIG. 5 is a more specific circuit diagram of a reference signal pulse generator and a timeliness comparator.
Figure 6:
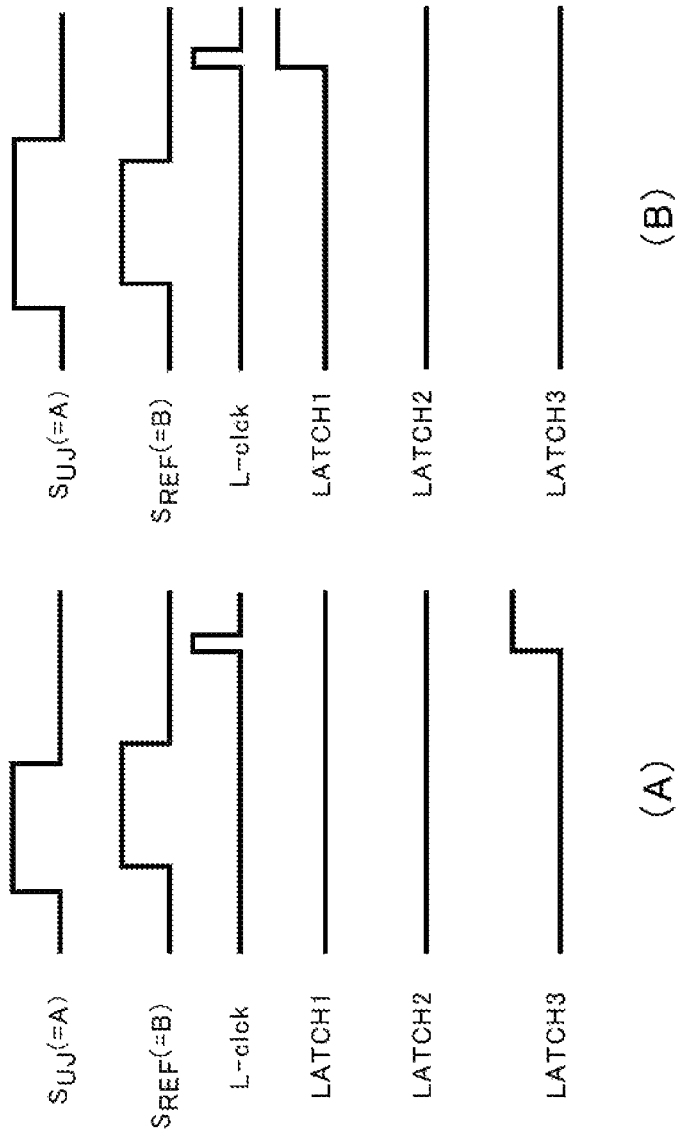
FIGS. 6 (A), (B) are waveform diagrams which show operation of the circuit of FIG. 5.

A circuit that reference signal pulse generator 11 and timing comparator 12 are embodied in are shown in FIG. 5. Operation waveforms of circuit of FIG. 5 are shown in FIGS. 6 (A), (B).

Figure 7:
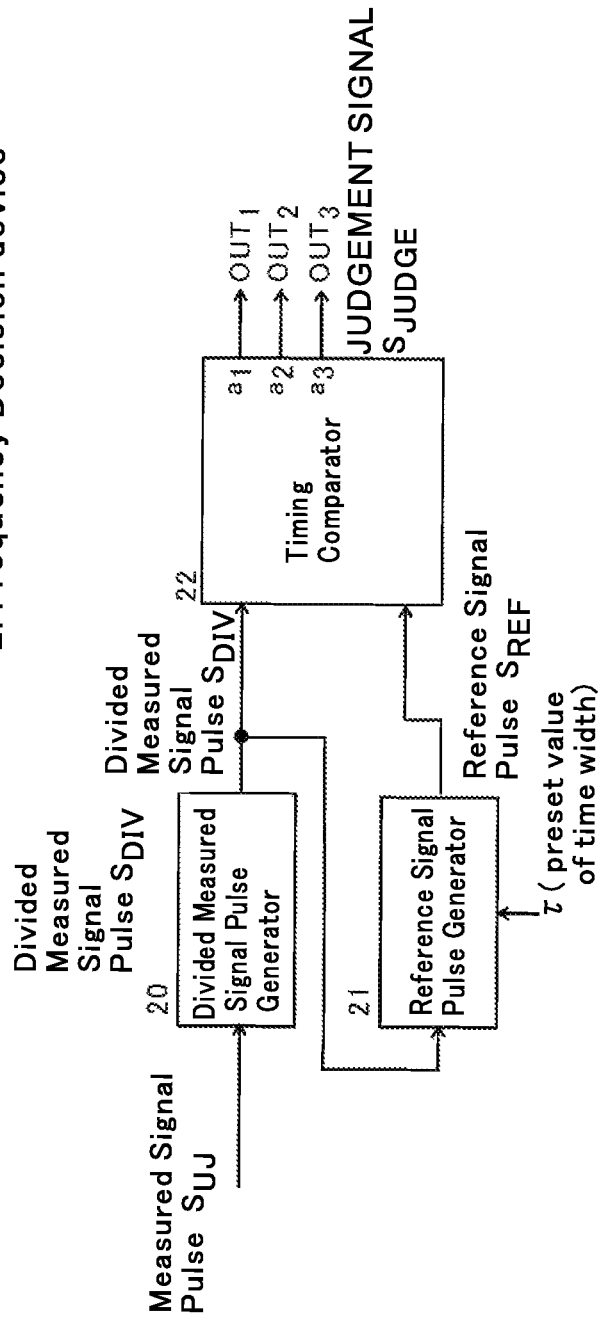
FIG. 7 is a block diagram which shows second embodiment of frequency decision device of the present invention.

FIG. 7 is a block diagram which shows second embodiment of a frequency decision device of the present invention. A frequency decision device 2 of FIG. 7 comprises a dividing measured signal generator 20, a reference signal pulse generator 21 and a timing comparator 22. The frequency decision device 2 inputs measured signal pulses $S_{UJ}$ of duty ratio $R_{DUTY}$ and determines a frequency high/low state of measured signal pulses $S_{UJ}$. The duty ratio $R_{DUTY}$ may change.

The divided measured signal pulse generator 20 generates divided measured signal pulses $S_{DIV}$. One period of divided measured signal pulses $S_{DIV}$ is two periods of measured signal pulses $S_{UJ}$. The reference signal pulse generator 21 generates reference signal pulse $S_{REF}$. A rising edge of a reference signal pulse $S_{REF}$ synchronizes in a rising edge of a divided measured signal pulse $S_{DIV}$. A time width from a rising edge to a falling edge is a predetermined time width $\tau_F$.

Figure 8:
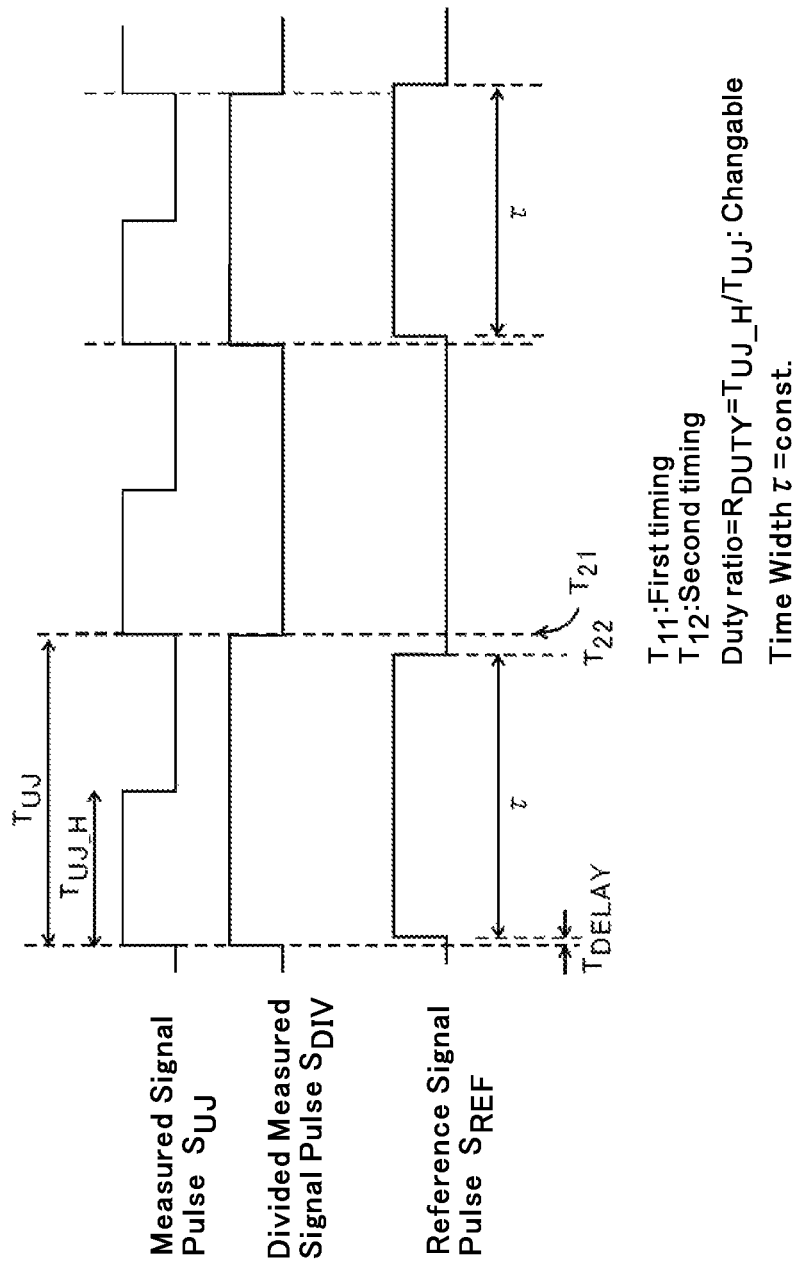
FIG. 8 is wave form diagram showing operation of the circuit of FIG. 7.

FIG. 8 shows a relationship of measured signal pulses $S_{UJ}$ and divided measured signal pulses $S_{DIV}$ and reference signal pulses $S_{REF}$. The timing comparator 22 compares a timing of a falling edge (first timing $T_{21}$) of a divided measured signal pulse $S_{DIV}$ and a timing of a falling edge (second timing $T_{22}$) of a reference signal pulse $S_{REF}$.

Results of comparison of the timing comparator 22 are three kinds of the next.

First timing $T_{21}$<Second timing $T_{22}$ (2-a)

First timing $T_{21}$=Second timing $T_{22}$ (2-b)

First timing $T_{21}$>Second timing $T_{22}$ (2-c)

When a relation of formula (2-a) is concluded, a frequency of measured signal pulses $S_{UJ}$ is higher than a reference frequency $f_{REF}$.

When a relations of formula (2-b) is concluded, a frequency of measured signal pulses $S_{UJ}$ is equal to a reference frequency $f_{REF}$.

Even more particularly, when a relations of the formula (2-c) is concluded, a frequency of measured signal pulses $S_{UJ}$ is lower than a reference frequency $f_{REF}$.

A reference frequency $f_{REF}$ is defined by next formula.

$$f_{REF}=1/(\tau+T_{DELAY})$$

$\tau$: Time width from a rising edge to a falling edge of reference signal pulse
$T_{DELAY}$: Delay time of a rising edge of a reference signal pulse to a rising edge of a divided measured signal pulse (0≤$T_{DELAY}$<$R_{DUTY}$*(a period of the measured signal pulse)).

In this embodiment, a judgment results output device 23 comprise three output terminals $o_1$, $o_2$, $o_3$.

$OUT_1$ is output from output terminal o1, $OUT_2$ is output from output terminal o2, and $OUT_3$ is output from an output terminal o3.

Figure 9:
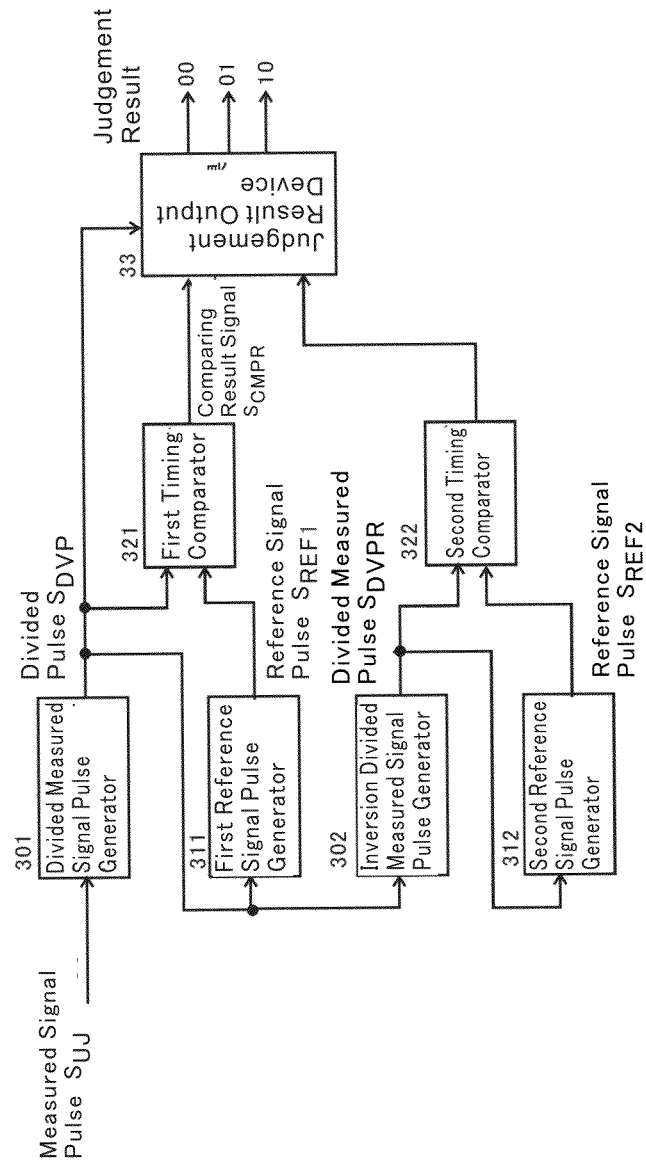
FIG. 9 is a block diagram which shows the third embodiment of the frequency decision device of the present invention.

FIG. 9 is a block diagram showing third embodiment of a frequency decision device of the present invention. A frequency decision device 3 of FIG. 9 comprises a divided measured signal pulse generator 301, an inversion divided measured signal pulse generator 302, a first reference signal pulse generator 311, a second reference signal pulse generator 312, a first timing comparator 321 and a second timing comparator 322. The frequency decision device 3 of FIG. 9 inputs measured signal pulses $S_{UJ}$ of duty ratio $R_{DUTY}$, and the frequency decision device 3 of FIG. 9 judges a frequency high/low state of measured signal pulses $S_{UJ}$. The Duty ratio $R_{DUTY}$ may change.

The divided measured signal pulse generator 301 inputs measured signal pulses $S_{UJ}$, and generates divided measured signal pulses $S_{DVP}$. One period of divided measured signal pulses $S_{DVP}$ is two periods of measured signal pulses $S_{UJ}$.

An inversion divided measured signal pulse generator 302 generates inversion divided measured signal pulses. The inversion divided measured signal pulses are signals which a divided measured signal pulses $S_{DVP}$ reversed. In this embodiment, the inversion divided measured signal pulse generator 302 inputs output $S_{DVP}$ of the divided measured signal pulse generator 301, and the inversion divided measured signal pulse generator 302 generates inversion divided measured signal pulses $S_{DVPR}$.

A first reference signal pulse generator 311 generates first reference signal pulses $S_{REF1}$. A rising edge of a first reference signal pulse $S_{REF1}$ synchronizes in a rising edge of a divided measured signal pulse $S_{DVP}$. A time width from a rising edge to a falling edge is predetermined time width $\tau_1$.

A second reference signal generator 312 generates second reference signal pulses $S_{REF2}$. A rising edge of a second reference signal pulse $S_{REF2}$ synchronizes in a rising edge of an inversion divided measured signal pulse $S_{DVPR}$. A time width $\tau_2$ to a falling edge is the same as time width $\tau_1$.

A first timing comparator 321 compares a falling edge (second timing $T_{22}$) of a first reference signal pulse $S_{REF1}$ with a falling edge (first timing T31) of a divided measured signal pulse $S_{DVP}$. And the first timing comparator 321 outputs a signal pulse $S_{CMPR}$.

A second timing comparator 322 compares a falling edge (fourth timing $T_{34}$) of a second reference signal pulse $S_{REF2}$ with a falling edge (third timing $T_{33}$) of an inversion divided measured signal pulse.

Results of comparison of first timing comparator 321 are three kinds of the next.

First timing $T_{31}$<Second timing $T_{32}$ (3-a1)

First timing $T_{31}$=Second timing $T_{32}$ (3-b1)

First timing $T_{31}$>Second timing $T_{32}$ (3-c1)

Results of comparison of second timing comparator 322 are three kinds of the next.

Third timing $T_{33}$<Fourth timing $T_{34}$ (3-a2)

Third timing $T_{33}$=Fourth timing $T34$ (3-b2)

Third timing $T_{33}$>Fourth timing $T34$ (3-c2)

When relations of formula (3-a1) or formula (3-a2) is concluded, frequency of measured signal pulse $S_{UJ}$ is higher than reference frequency $f_{REF}$.

When relations of formula (3-b1) or formula (3-b2) is concluded, frequency of measured signal pulse $S_{UJ}$ is equal to reference frequency $f_{REF}$.

When relations of formula (3-c1) or formula (3-c2) is concluded, frequency of measured signal pulse $S_{UJ}$ is lower than reference frequency $f_{REF}$.

Reference frequency $f_{REF}$ is defined in the next formula.

$$f_{REF}=1/(\tau+T_{DELAY})$$

τ: Time Width from rising edge to a falling edge of first reference signal pulse or second reference signal pulse $T_{DELAY}$: Delay time of rising edge of first reference signal pulse to rising edge of divided measured signal pulse, or delay time of rising edge of second reference signal pulse to inversion divided measured signal pulse $$(0 \leq T_{DELAY} < R_{DUTY} * (\text{a period of measured signal pulse}).$$

Figure 10:
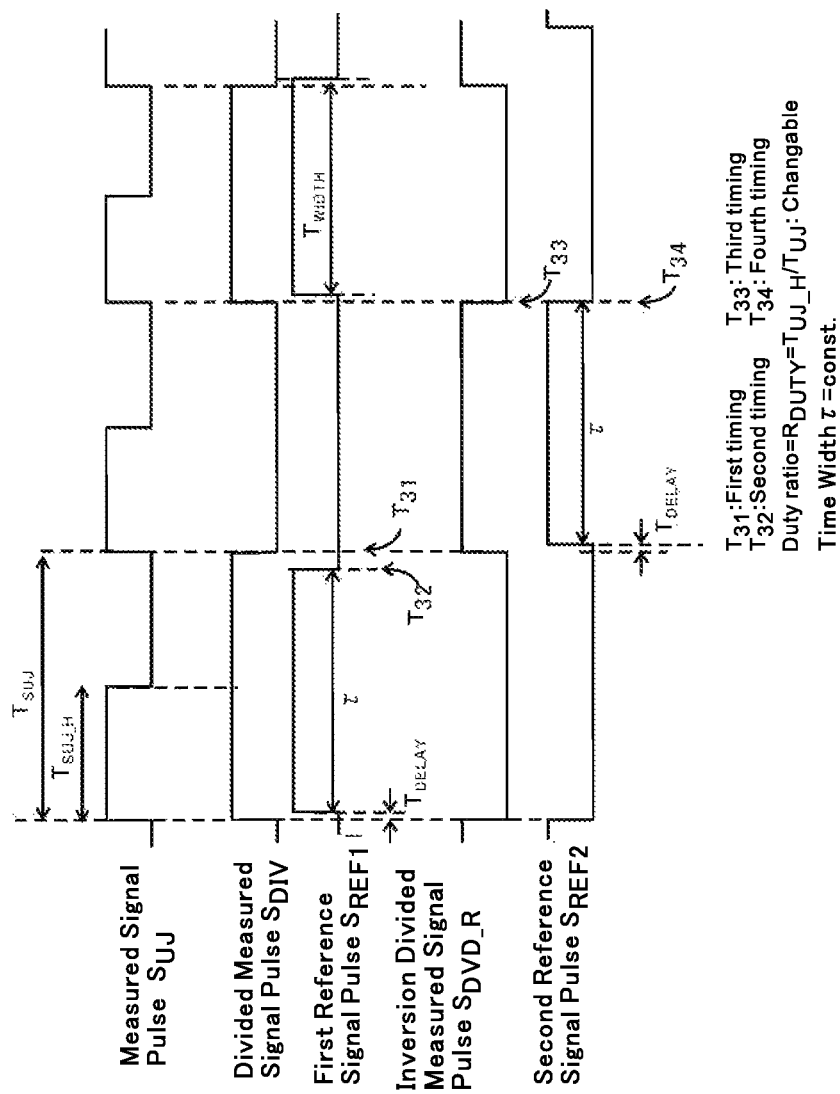
FIG. 10 is a wave form diagram which shows operation of the circuit of FIG. 9.

In this embodiment, judgment results output device 33 comprise three output terminals $o_1, o_2, o_3$ as shown in FIG. 10.

$OUT_1$ is output from output terminal $o_1$, $OUT_2$ is output from output terminal $o_2$, and $OUT_3$ is output from output terminal $o_3$.

Figure 11:
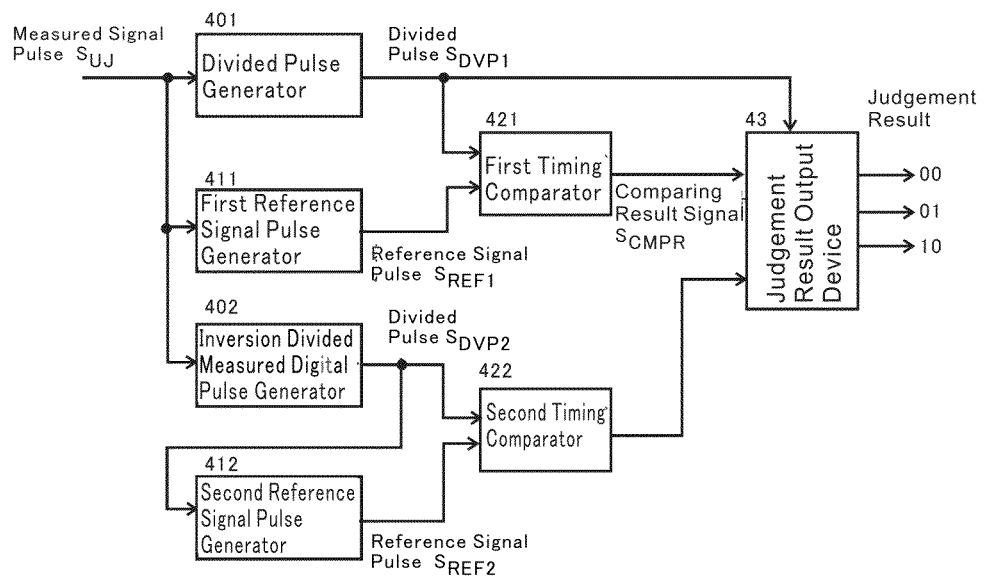
FIG. 11 is a block diagram which shows fourth embodiment of the frequency decision device of the present invention.

FIG. 11 is a block diagram showing fourth embodiment of frequency decision device of the present invention. A frequency decision device 4 of FIG. 11 comprises a dividing measured signal generator 401, a first dividing measured signal generator 401, a first dividing measured signal generator 402, a first reference signal pulse generator 411, a second reference signal pulse generator 412, a first timing comparator 421 and a second timing comparator 422. The frequency decision device 4 inputs measured signal pulses $S_{UJ}$ of duty ratio $R_{DUTY}$ and judges a frequency high/low state of measured signal pulses $S_{UJ}$. Duty ratio $R_{DUTY}$ may change.

First divided measured signal pulse generator 401 inputs measured signal pulses $S_{UJ}$, and generates first divided measured signal pulse $S_{DVD1}$. One period of first divided measured signal pulses $S_{DVD1}$ is two periods that it counted from a falling edge of measured signal pulses $S_{UJ}$.

Second divided measured signal pulse generator 402 inputs measured signal pulses $S_{UJ}$, and generates second divided measured signal pulses $S_{DVD2}$.

One period of second divided measured signal pulses $S_{DVD2}$ is two periods counted from a falling edge of measured signal pulses $S_{UJ}$.

First reference signal pulse generator 411 generates first reference signal pulses $S_{REF1}$. A rising edge of a first reference signal pulse $S_{REF1}$ synchronizes in a rising edge of a first divided measured signal pulse $S_{DVD1}$. A time width from a rising edge to a falling edge is predetermined time width $\tau_1$.

Second reference signal pulse generator 412 generates second reference signal pulses $S_{REF2}$.

A falling edge of second reference signal pulse $S_{REF2}$ synchronizes in a rising edge of second divided measured signal pulse $S_{DVD2}$.

A predetermined time width $\tau_2$ from a rising edge to a falling edge is the same as predetermined time width $\tau_1$.

First timing comparator 421 compares second timing $T_{42}$ with first timing $T_{41}$.

First timing $T_{41}$ is a falling edge of first divided measured signal pulse $S_{DVD1}$.

Second timing $T_{42}$ is a falling edge of first reference signal pulse $S_{REF}$.

Second timing comparator 422 compares fourth timing $T_{44}$ with third timing $T_{43}$.

Third timing $T_{43}$ is a falling edge of second divided measured signal pulse $S_{DVD2}$.

Fourth timing $T_{44}$ is a falling edge of second reference signal pulse $S_{REF2}$.

Results of comparison of first timing comparator 421 are three kinds of the next.

First timing $T_{41}$<Second timing $T_{42}$ (4-a1)

First timing $T_{41}$=Second timing $T_{42}$ (4-b1)

First timing $T_{41}$>Second timing $T_{42}$ (4-c1)

Results of comparison of second timing comparator 322 are three kinds of the next.

Third timing $T_{43}$<Fourth timing $T_{44}$ (4-a2)

Third timing $T_{43}$=Fourth timing $T_{44}$ (4-b2)

Third timing $T_{43}$>Fourth timing $T_{44}$ (4-c2)

When relations of formula (4-a1) or formula (4-a2) is concluded, frequency of measured signal pulse $S_{UJ}$ is higher than reference frequency $f_{REF}$.

When relations of formula (4-b1) or formula (4-b2) is concluded, frequency of measured signal pulse $S_{UJ}$ is equal to reference frequency $f_{REF}$.

When relations of formula (4-c1) or formula (4-c2) is concluded, frequency of measured signal pulse $S_{UJ}$ is lower than reference frequency $f_{REF}$.

Reference frequency $f_{REF}$ is defined in the next formula.

$$f_{REF}=1/(\tau+T_{DELAY})$$

τ: The time width from a rising edge to falling edge of first reference signal pulse or second reference signal pulse $T_{DELAY}$: Delay time of rising edge of first reference signal pulse to rising edge of the divided measured signal pulse Delay time of rising edge of second reference signal pulse to inversion divided measured signal pulse $$(0 \leq T_{DELAY} < R_{DUTY} * (\text{period of the measured signal pulse})).$$

Figure 12:
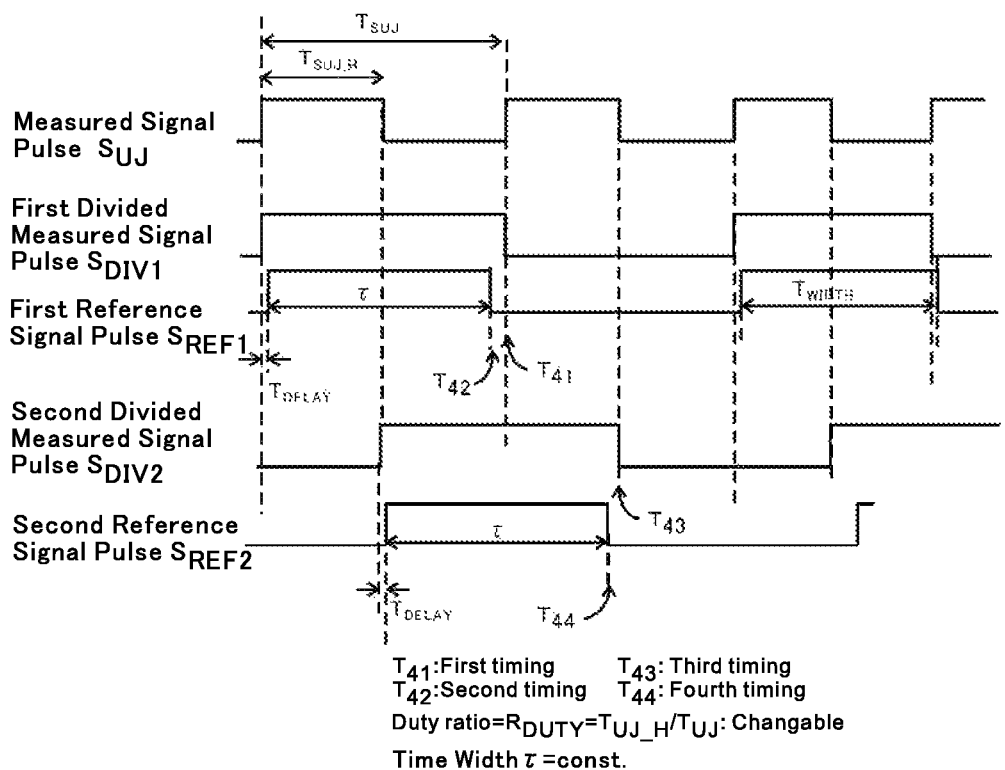
FIG. 12 is a wave form diagram which shows operation of the circuit of FIG. 11.

In this embodiment, judgment result output device 43 comprises three output terminals $o_1$, $o_2$, $o_3$ as shown in FIG. 12. $OUT_1$ is output from output terminal $o_1$, and $OUT_2$ is output from output terminal $o_2$, and $OUT_3$ is output from output terminal $o_3$.

Figure 13:
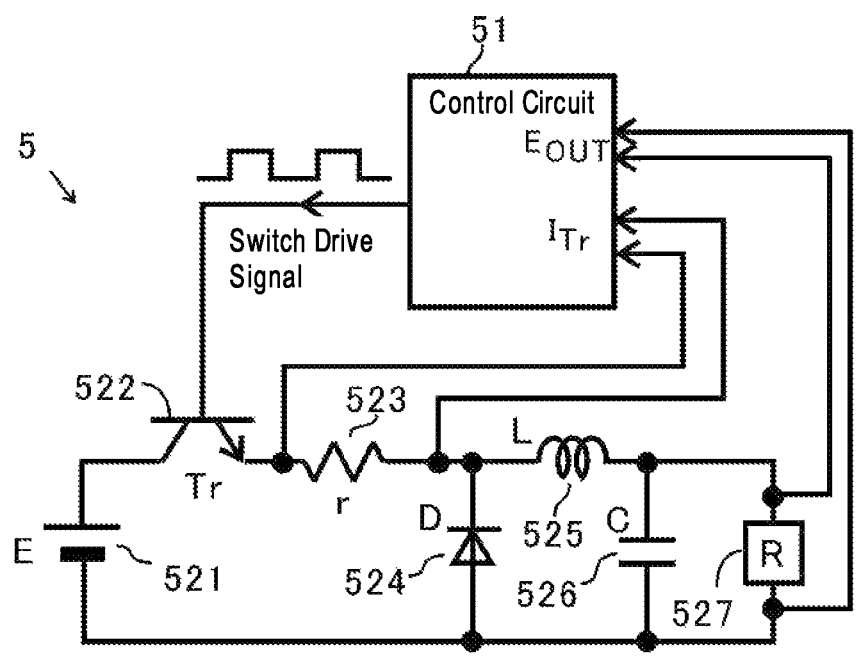

FIG. 13 shows example which applied frequency decision device (DC/DC converter in FIG. 13) of the present invention to power conversion equipment. In FIG. 13, DC/DC converter 5 comprises transistor switch 522, flywheel diode 524, flywheel diode 524 that accumulate and release energy, and smoothing capacitor 526.

Control circuit 51 is connected to transistor switch 522. DC power supply 521 (E) is connected to input terminal of DC/DC converter 5, and load 527 (R) is connected to output terminal. DC power supply 521 (E) is connected to transistor switch 522.

Figure 14:
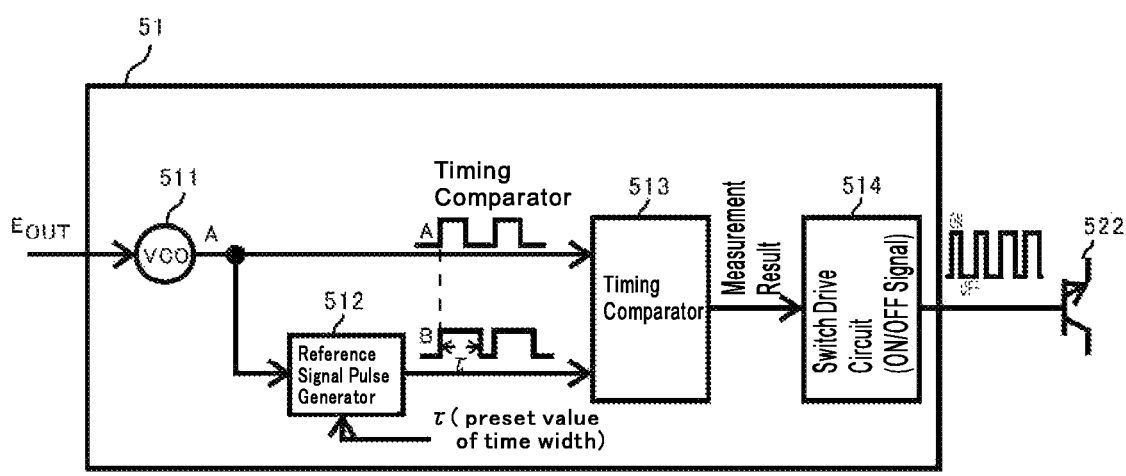
FIG. 14 is an explanatory drawing of control device of the DC/DC converter of FIG. 13.

FIG. 14 is a block diagram which shows control circuit 51 become simply. In this embodiment, measured signal pulse A is the output of voltage-to-frequency converter (in FIG. 14 VCO) 511. Input voltage (output voltage $E_o$ of DC/DC converter 5) of VCO 511 is compared with the voltage value corresponding to ON time of reference signal pulse B.

Control circuit 51 is comprised of voltage-to-frequency converter (in FIG. 14 VCO) 511, reference signal pulse generator 512, timing comparator 513 and switch drive circuit 514.

An embodiment is shown in FIG. 14, wherein control circuit 51 detects output voltage $E_o$ and controls transistor switch 522. Control circuit 51 further can detect switch electric current $I_{Tr}$, and control transistor switch 522 (the illustration does not present). The detection principle of the value of switch electric current $I_{Tr}$ is the same as a detection principle of output voltage $E_o$.

Reference signal pulse generator 512 inputs measured signal pulse A, and outputs reference signal pulse B which synchronized in rising edge a. According to the present invention, timing of this falling edge b delays only for certain constant time ($T_{DELAY}$). In this embodiment, in convenience of the explanation, it is $T_{DELAY}=0$.

As shown in FIG. 15 (A), (B), as output voltage $E_{OUT}$ grows big the output of VCO 511 grows big. And, in a certain time, order of falling edge a of measured signal pulse A and falling edge b of reference signal pulse B reverses. That is, order which was (b, a), (b, a) . . . at first changes to (a, b) (cf. time $t_{rvs}$ of FIG. 15 (A)).

This means that "on width" of measured signal pulse A exceeds "on width" of the reference signal pulse. "'On width' of measured signal pulse A exceeds 'on width' of the reference signal pulse" is equivalent to "output voltage $E_{OUT}$ has reached upper limit threshold $Th_a$" substantially.

Figure 16:
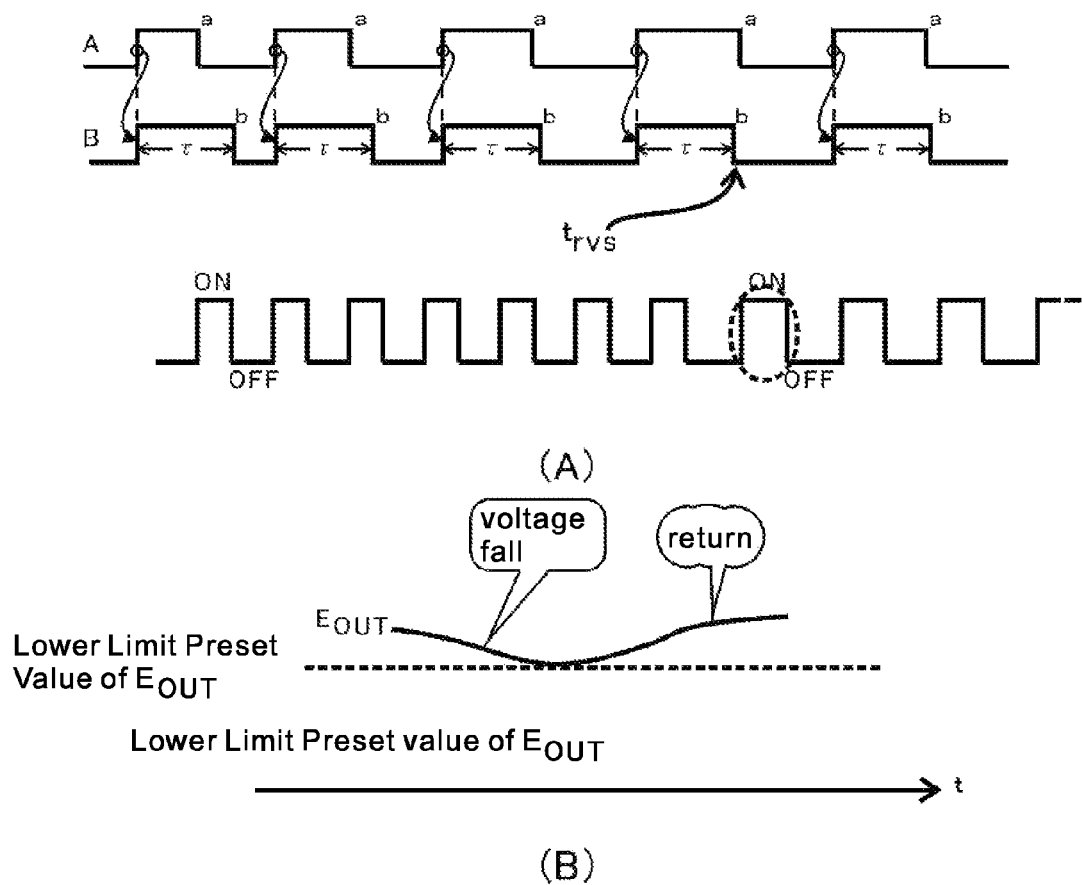
FIG. 16(A) is a illustration which shows operation of the control device of FIG. 14.
FIG. 16(B) is illustration showing state that the output of the DC/DC converter decreases.

As shown in FIG. 16 (A), (B), as output voltage $E_{OUT}$ shrinks, the output of VCO 511 shrinks. And, in a certain time, order of falling edge a of measured signal pulse A and falling edge b of reference signal pulse B reverses (cf. time $t_{rvs}$ of FIG. 16 (A)). That is, order which was (a, b), (a, b) . . . at first changes to (b, a) (cf. time $t_{rvs}$ of FIG. 15 (A)). This means that "on width" of measured signal pulse A becomes narrower than "ON time width" of the reference signal pulse. "ON time width of measured signal pulse A becomes narrower than ON time width of the reference signal pulse" is equivalent to "output voltage $E_{OUT}$ has reached lower limit threshold $Th_a$" substantially.

Figure 17:
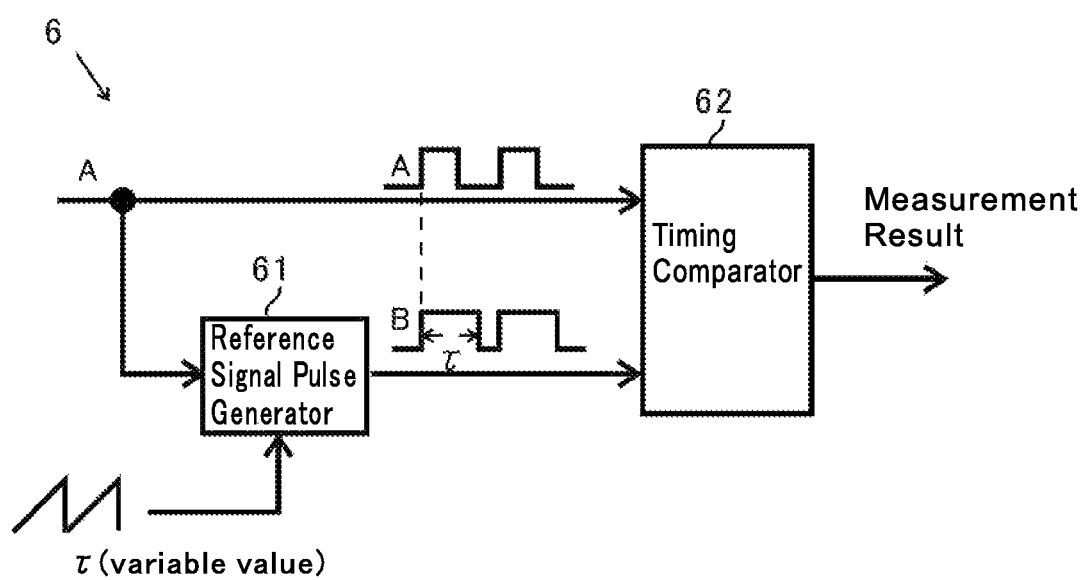
FIG. 17 is a block diagram which shows a frequency detection apparatus of the present invention.

FIG. 17 is explanation which shows a frequency measurement device of the present invention. In FIG. 17, frequency measurement device 6 comprises reference signal pulse generator 61 and timing comparator 62. Reference signal pulse generator 61 is constructed to increase size of ON time width τ every during some period of time.

When ON time width τ of reference signal pulse B accorded with ON time width of measured signal pulses A almost, a value of ON time width τ can be detected, and frequency of reference signal pulse B can be thereby detected.

The invention claimed is:

1. A frequency decision device which inputs a judgment target signal pulse, and determines a frequency of the judgment target signal pulse, wherein the frequency decision device comprising:
   a dividing judgment target signal pulse generator which generates a dividing judgment target signal pulse of which one period is equal with two periods of the judgment target signal pulse,
   a reference signal pulse generator which generates a reference signal pulse of which a rising edge synchronizes with a rising edge of the dividing judgment target signal pulse and of which a time width from the rising edge to a falling edge is predetermined, and
   a timing comparator that compares first timing which is the falling edge of the dividing judgment target signal pulse and second timing which is the falling edge of the reference signal pulse,
   wherein difference between the frequency of the judgment target signal pulse and a reference frequency is judged on the basis of an order of the first timing and the second timing,
   wherein the reference frequency is represented in a next formula, $$f_{REF}=1/(\tau+T_{DELAY})$$

$f_{REF}$: reference frequency
   τ: time width from the rising edge to the falling edge of the reference signal pulse
   $T_{DELAY}$: delay time of the rising edge of the reference signal pulse to the rising edge of the dividing judgment target signal pulse.

2. The frequency decision device according to claim 1, wherein the relationship between the first timing and the second timing is at least one of the followings:
   the first timing<the second timing
   the first timing=the second timing
   the first timing>the second timing.

3. A control circuit of a power conversion equipment using the frequency decision device according to claim 1, wherein the judgment target signal pulse is output signal of a voltage-to-frequency converter of which input is output voltage of the power conversion equipment.

4. The frequency decision device according to claim 1, wherein a frequency measurement equipment detects the frequency of the judgment target signal pulse by sweeping the value of the time width from the rising edge to the falling edge of the reference signal pulse.

\* \* \* \* \*